US005482799A

United States Patent [19]
Isao et al.

[11] Patent Number: 5,482,799
[45] Date of Patent: Jan. 9, 1996

[54] PHASE SHIFT MASK AND MANUFACTURING METHOD THEREOF

[75] Inventors: Akihiko Isao; Susumu Kawada, both of Saitama; Nobuyuki Yoshioka, Hyogo, all of Japan

[73] Assignees: Mitsubishi Denki Kabushiki Kaisha; Dainippon Printing Co., Ltd., both of Tokyo; Ulvac Coating Corporation, Saitama, all of Japan

[21] Appl. No.: 318,156

[22] Filed: Oct. 5, 1994

[30] Foreign Application Priority Data

Oct. 8, 1993 [JP] Japan ................................... 5-253198
Sep. 7, 1994 [JP] Japan ................................... 6-214002

[51] Int. Cl.$^6$ ............................................. G03F 9/00
[52] U.S. Cl. ............................. 430/5; 430/322; 430/324
[58] Field of Search ................................. 430/5, 322, 324

[56] References Cited

U.S. PATENT DOCUMENTS

| | | | |
|---|---|---|---|
| 4,661,426 | 4/1987 | Matsuda et al. | 430/5 |
| 4,890,309 | 12/1989 | Smith et al. | 378/35 |
| 5,286,581 | 2/1994 | Lee | 430/5 |

FOREIGN PATENT DOCUMENTS

| | | |
|---|---|---|
| 57-62052 | 4/1982 | Japan . |
| 58-173744 | 10/1983 | Japan . |

OTHER PUBLICATIONS

"Imaging Characteristics of Multi–Phase Shifting and Half-tone Phase–Shifting Masks", Terasawa et al., JJAP Series 5 Proc. of 1991 Intern. MicroProcess Conference, pp. 3–9.

Primary Examiner—S. Rosasco
Attorney, Agent, or Firm—Lowe, Price, LeBlanc & Becker

[57] ABSTRACT

A phase shift mask of the present invention includes a quartz substrate transmitting exposure light, a transmitting film having a predetermined transmittance formed on the main surface of quartz substrate, a light transmitting portion from which quartz substrate is exposed is formed in a predetermined region, and a phase shifter portion formed of a single material on light transmitting film converting the phase angle by approximately 180° and having a transmittance of 3–20% with respect to the exposure light transmitted through light transmitting portion. As a result, a defect generated in the phase shifter portion can be easily detected with an ordinary defect inspection apparatus without deteriorating the phase shifter portion as a phase shift mask.

7 Claims, 13 Drawing Sheets

PHASE SHIFT MASK AND MANUFACTURING METHOD THEREOF

BACKGROUND OF THE INVENTION

1. Field of the Invention

The present invention generally relates to phase shift masks, and particularly, to a structure of a light-attenuating phase shift mask attenuating exposure light and a method of manufacturing the same.

2. Description of the Background Art

Recently, high integration and miniaturization have been greatly developed in semiconductor integrated circuits. Accordingly, miniaturization of circuit patterns formed on a semiconductor substrate (hereinafter simply referred to as a "wafer" has been developed rapidly. A photolithography technique is, among others, well known in the art as a basic technique for pattern formation, for which various developments and improvements have been made. However, there is still an increasing need for miniaturization of a pattern, and thus, there is still a strong need for improvement in resolution of a pattern.

In general, a resolution limit R(nm) in the photolithography technique using a demagnification exposure method is expressed as $$R = k_1 \cdot \lambda / (NA) \qquad (1)$$

where $\lambda$ represents a wavelength (nm) of light to be used, NA represents a numerical aperture of a lens, and $k_1$ is a constant depending on a resist process.

As can be seen from the above expression, a resolution limit is improved as far as values of $k_1$ and $\lambda$ are made smaller and a value of NA is made larger. In other words, it is sufficient to reduce the constant depending on the resist process with the wavelength being shorter and NA being increased. However, it is difficult technically to improve a light source or a lens, and resolution is degraded because a depth of focus $\delta$ of light ($\delta = k_2 \cdot \lambda / (NA)^2$) is made smaller by shortening the wavelength and increasing NA.

Figure 18:
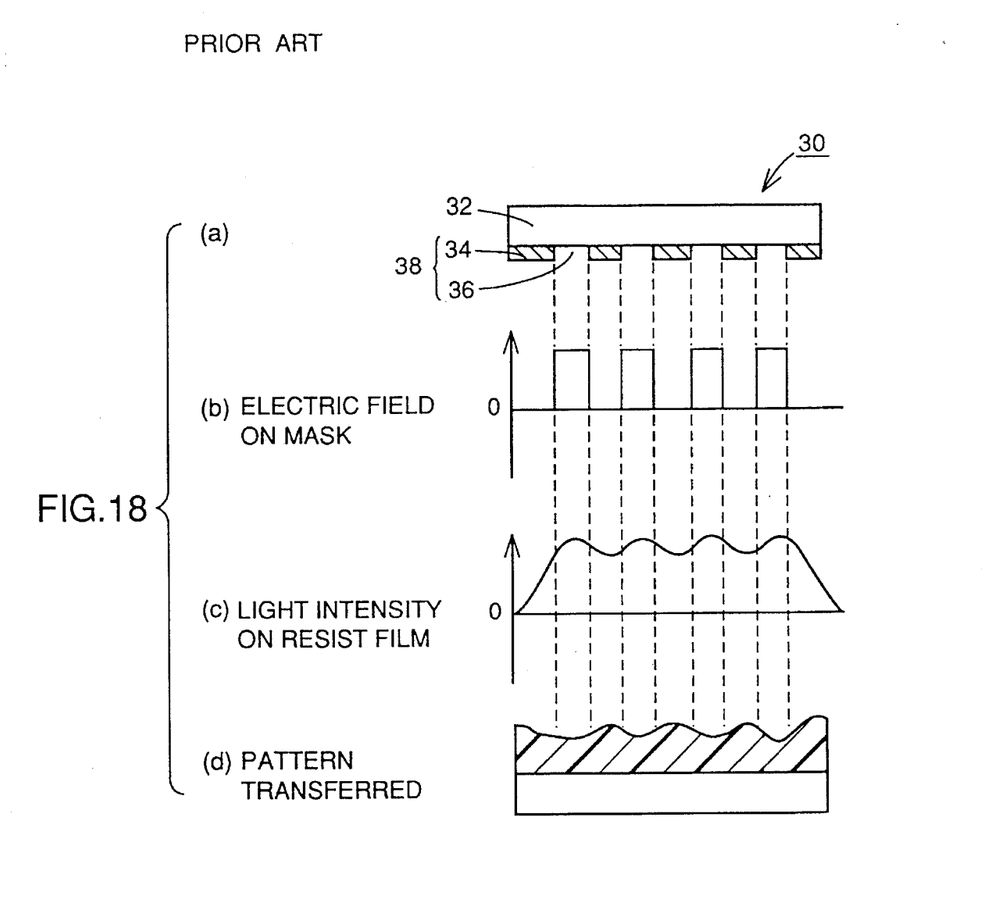
FIG. 18 schematically shows a cross section of a mask, electric field of exposure light on the mask, the light intensity on a semiconductor wafer, and a pattern transferred onto a resist film in the case of a conventional photomask.

With reference to FIG. 18, description will now be made of a cross section of a photomask, electric field on the mask, and a light intensity on a wafer, when a conventional photomask is used.

Referring to FIG. 18(a), a structure of a photomask 30 will be first described. A mask pattern 38 having a predetermined shape is formed on a transparent glass substrate 32. Mask pattern 38 includes a light shielding portion 34 formed of chromium or the like and a light transmitting portion 36 from which transparent glass substrate 32 is exposed.

Referring to FIG. 18(b), the electric field of exposure light on photomask 30 is provided along the photomask pattern.

Referring to FIG. 18(c), the light intensity on a semiconductor wafer will be described. When a fine pattern is to be transferred, beams of exposure light transmitted through the photomask intensify with each other in a portion of adjacent pattern images where beams of light are overlapped, because of diffraction and interference.

Therefore, a difference in the light intensity on the semiconductor wafer is reduced, so that a resolution is deteriorated. As a result, a pattern transferred onto a resist film cannot reflect the photomask pattern precisely as shown in FIG. 18(d).

In order to solve this problem, a phase shift exposure method using a phase shift mask is proposed in Japanese Patent Laying-Open Nos. 57-62052 and 58-173744.

Figure 19:
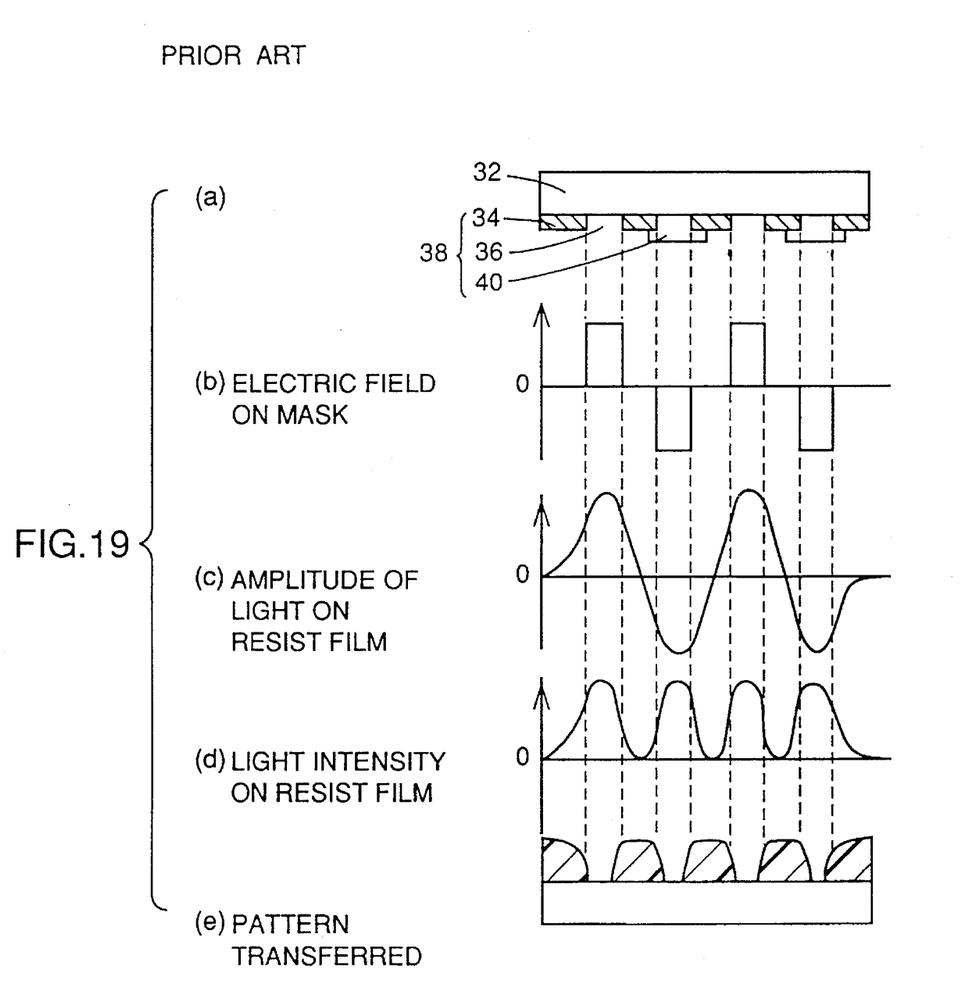
FIG. 19 schematically shows a cross section of a phase shift mask, electric field on the phase shift mask, the amplitude of light on a resist film, the light intensity on the resist film, and a pattern transferred onto the resist film in the case of a conventional phase shift mask.

With reference to FIG. 19, a phase shift exposure method using a phase shift mask disclosed in Japanese Patent Laying-Open No. 58-173744 will now be described.

Referring to FIG. 19(a), a structure of the phase shift mask will be described. A phase shifter 40 formed of a transparent insulating film such as a silicon oxide film is provided at every other light transmitting portion 36 of a mask pattern 38 formed on a glass substrate 32.

Referring to FIG. 19(b), the electric field on the phase shift mask formed by beams of light transmitted through phase shifter 40 has phases converted alternately by 180°. Therefore, in adjacent pattern images, overlapping beams of exposure light transmitted through phase shifter 40 have phases converted from each other. Accordingly, the amplitude of light on a resist mask is as shown in FIG. 19(c). As to the light intensity on the resist film, beams of light are canceled with each other due to interference in a portion where beams of light are overlapped, as shown in FIG. 19(d). As a result, there is provided a sufficient difference in the light intensity on the resist film, allowing improvement of the resolution, so that a pattern reflecting the mask pattern can be transferred onto the resist film as shown in FIG. 19(e).

However, although the above-described phase shift mask is highly effective with respect to a periodic pattern such as line and space, arrangement of phase shifters and the like becomes very difficult in the case of a complex pattern, so that the phase shifter cannot be arbitrarily set.

The inventors of the present invention disclose a light-attenuating phase shift mask in Japanese Patent Application No. 5-91445. The light-attenuating phase shift mask disclosed in Japanese Patent Application No. 5-91445 will be described with reference to FIG. 20.

Figure 20:
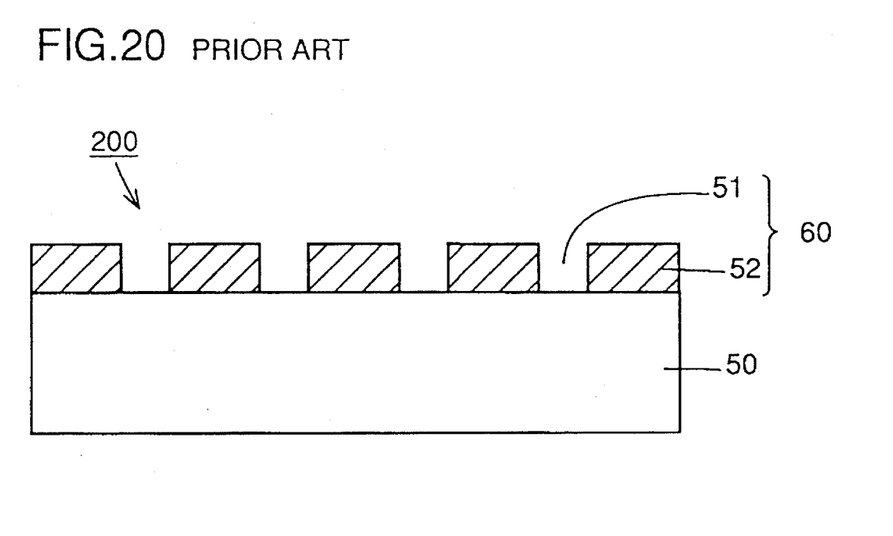
FIG. 20 is a sectional view of a conventional light-attenuating phase shift mask.

A light-attenuating phase shift mask 200 includes a quartz substrate 50 transmitting exposure light, and a phase shift pattern 60 formed on the main surface of quartz substrate 50. Phase shift pattern 60 includes a light transmitting portion 51 from which quartz substrate 50 is exposed, and a phase shift portion 52 formed of a single material converting the phase angle of the exposure light by approximately 180° and having a transmittance of 3–20% with respect to the exposure light transmitting through light transmitting portion 51.

Figure 21:
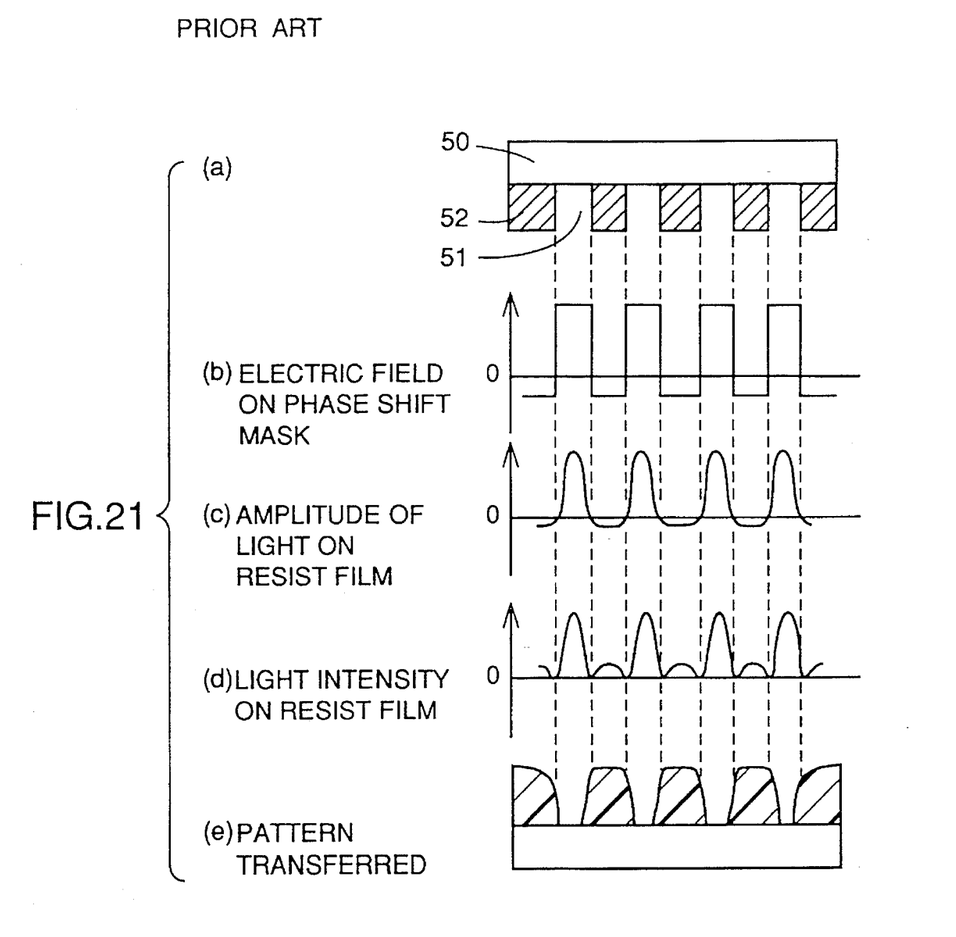
FIG. 21 schematically shows a cross section of a mask, electric field on the mask, the amplitude of light on a resist film, the light intensity on the resist film, and a pattern transferred onto the resist film, in the case of the conventional light-attenuating phase shift mask.

Referring to FIG. 21, description will now be given of electric field on a mask of exposure light transmitted through phase shift mask 200 as structured above, the amplitude of light on a resist film, the light intensity on the resist film, and a pattern to be transferred onto the resist film.

FIG. 21(a) is a sectional view of phase shift mask 200. The electric field on the mask has a phase converted at an edge portion of the exposure pattern as shown in FIG. 21(b), thus providing the amplitude of exposure light on the resist film as shown in FIG. 21(c). Therefore, the light intensity on the resist film is necessarily 0 at the edge portion of the exposure pattern, as shown in FIG. 21(d). As a result, there is provided a sufficient difference in the electric field of exposure pattern between light transmitting portion 51 and phase shifter portion 52 so as to obtain high resolution, whereby the pattern reflecting the phase shift pattern can be transferred onto the resist film as shown in FIG. 21(e).

Description will now be given of a method of manufacturing phase shift mask 200 using a molybdenum silicide film or a molybdenum silicide nitride oxide film as a phase shifter film.

FIGS. 22 to 25 are sectional views showing the manufacturing process of phase shift mask 200 shown in FIG. 20.

Figure 22:
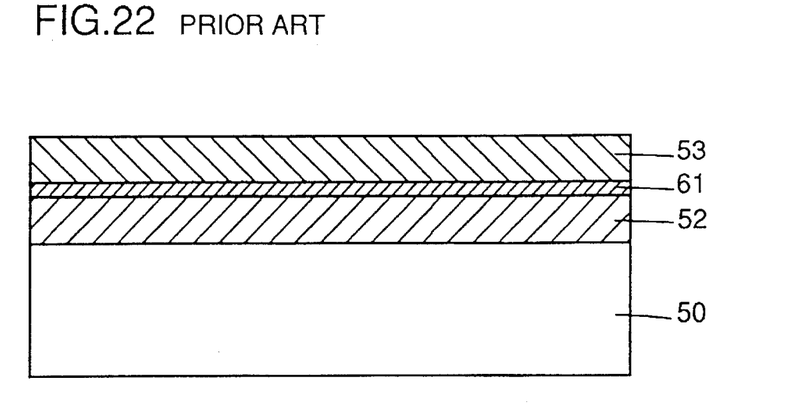
FIGS. 22 to 25 are sectional views showing the first to the fourth steps of the manufacturing process of the conventional light-attenuating phase shift mask.

Referring to FIG. 22, a phase shifter film 52 of a molybdenum silicide oxide film or a molybdenum silicide nitride oxide film is first formed on quartz substrate 50 with a sputtering method. Then, in order to stabilize the transmittance of phase shifter film 52, heating at a temperature of 200° C. or more is carried out using a clean oven or the like. Because of this heating, a transmittance variation (0.5–1.0%) caused by heating (at approximately 180° C.) such as a resist application step at formation of phase shifter film 52 can be prevented in advance.

In order to prevent charging-up at the time of exposure of an electron beam resist film, to be formed later, by electron beams, a charge dissipating film 61 formed of molybdenum or the like of approximately 100 Å thick is formed. Then, an electron beam resist film 53 (ZEP-810S® manufactured by Nippon Zeon Co., Ltd.) of approximately 5000 Å thick is formed on charge-dissipating film 61.

Figure 23:
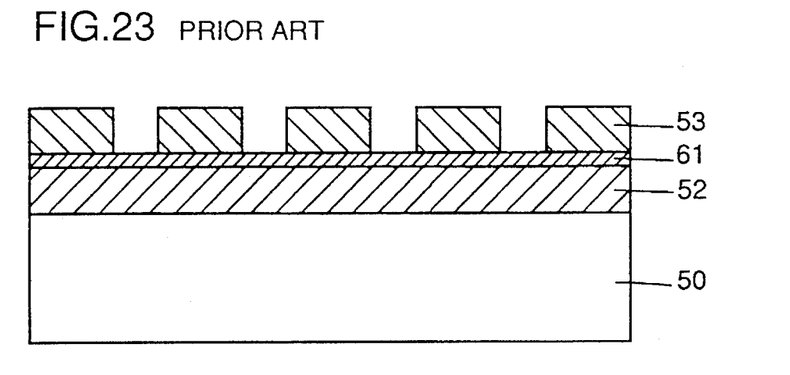

Referring to FIG. 23, electron beams are directed at a predetermined position of electron beam resist film 53. By developing resist film 53, resist film 53 having a predetermined resist pattern is formed.

Figure 24:
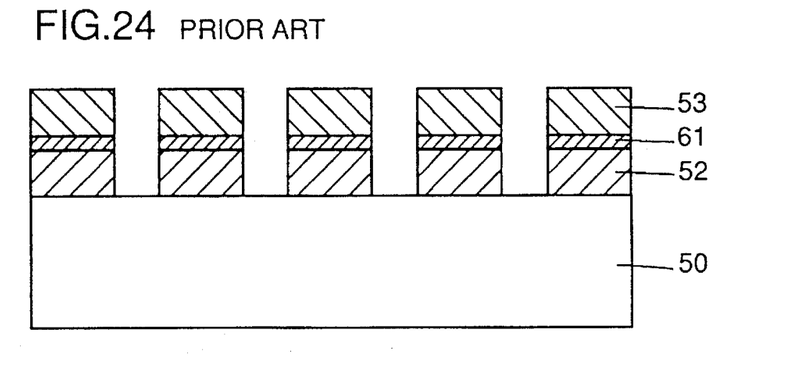

Referring to FIG. 24, charge-dissipating film 61 and phase shifter film 52 are etched with resist film 53 used as a mask. This etching is carried out with a parallel plate type RF ion etching device, with the distance between electrode substrates set to 160 mm, the working pressure set to 0.3 Torr, the reactive gas of $CF_4$ and $O_2$ having flow rates of approximately 95 sccm and approximately 5 sccm, respectively, and the etching time set to approximately 12 minutes.

Figure 25:
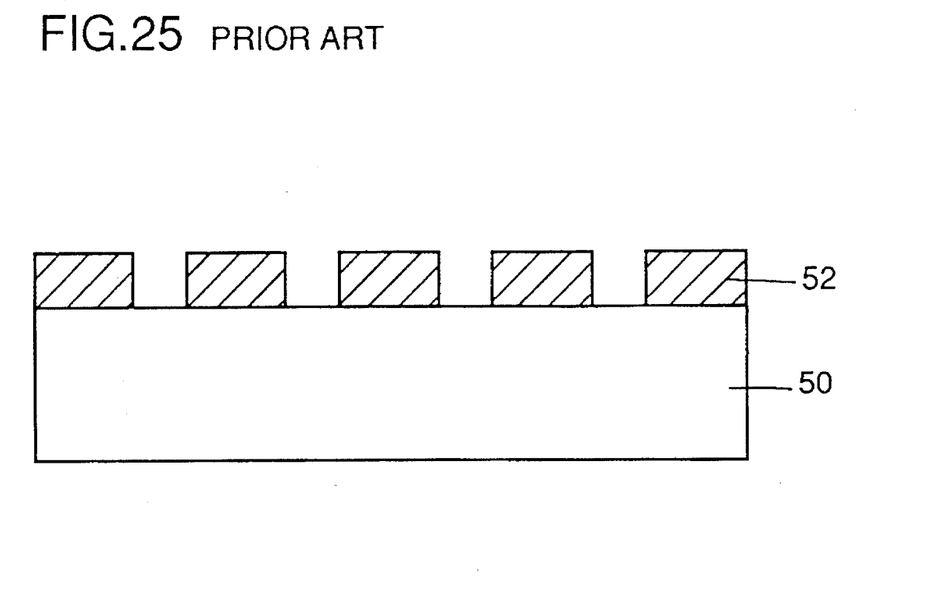

Then, referring to FIG. 25, resist film 53 and charge dissipating film 61 are removed. Accordingly, phase shift mask 200 disclosed by Japanese Patent Application No. 5-91445 is completed.

However, the above prior art has the following problems.

Figure 26:
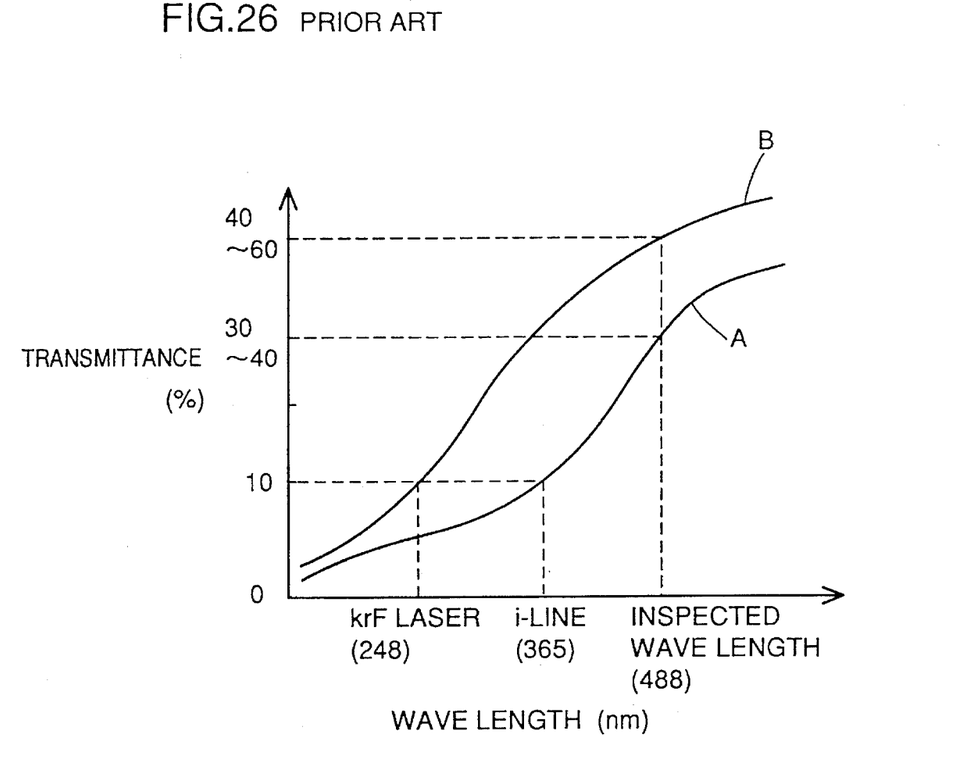
FIG. 26 is a diagram showing the relationship between transmittance and wavelength of a phase shifter film.

Referring to FIG. 26, phase shifter film 52 formed of a molybdenum silicide oxide film (solid line A in the figure) or a molybdenum silicide nitride oxide film (solid line B in the figure) has a transmittance of 10% or less with respect to a krF laser (248 nm), while it has a transmittance of 30% to 60% with respect to light having a wavelength of 488 nm of a defect inspection apparatus used for inspection of a defect of a phase shift mask, for example.

Therefore, when an ordinary defect inspection apparatus (KLA 3 series) using light having a wavelength of 488 nm is used for inspection of a phase shift mask, detection sensitivity for a defect generated on a phase shift mask becomes small.

SUMMARY OF THE INVENTION

One object of the present invention is to provide a phase shift mask having a structure in which a defect generated on a phase shift mask can be detected using an ordinary defect inspection apparatus without decreasing performance of the phase shift mask, and a method of manufacturing the same.

The phase shift mask according to the present invention includes a substrate transmitting exposure light, and a phase shifter portion formed in a predetermined region on the substrate and converting the phase angle of the transmitted exposure light by approximately 180° and having a transmittance of 3–20% of the transmitted exposure light. The phase shifter portion includes a monolayer film formed of an approximately homogeneous material, and a transmitting film whose transmittance is less dependent on a wavelength when used in combination with the monolayer film.

Preferably, the phase shift mask has in a predetermined region on the substrate a light transmitting portion from which the substrate is exposed.

More preferably, the phase shift mask has the transmitting film on the substrate surface of the light transmitting portion from which the substrate is exposed.

More preferably, the monolayer film is formed of at least a material selected from the group consisting of oxide of molybdenum silicide and molybdenum silicide nitride oxide, and the transmitting film is formed of at least a material selected from the group consisting of molybdenum, molybdenum silicide, silicon, tantalum nitride, gold, platinum, silicon nitride, silicon oxide, silicon nitride oxide, titanium, tantalum, tungsten, tantalum oxide, tantalum nitride oxide, titanium oxide, titanium nitride, titanium nitride oxide, tungsten oxide, niobium, niobium oxide, niobium nitride oxide, and silicon carbide.

More preferably, the monolayer film is formed of at least a material selected from the group consisting of molybdenum silicide oxide and molybdenum silicide nitride oxide, and the transmitting film is formed of at least a material selected from the group consisting of chromium, chromium oxide, chromium nitride oxide, chromium nitride carbide oxide, nickel chromium, nickel, Inconel, indium oxide, tin oxide, tin indium oxide, aluminum, and aluminum oxide.

The method of manufacturing a phase shift mask according to the present invention includes the following steps. First, formed in a predetermined region on the main surface of a substrate transmitting exposure light is a phase shifter film converting the phase angle of transmitted exposure light by approximately 180° and having a transmittance of 3–20% of transmitted exposure light. Then, a charge-dissipating film is formed on the phase shifter film.

Then, a resist film having a predetermined pattern shape is formed on the charge-dissipating film by an electron beam exposure method.

Then, the charge-dissipating film and the phase shifter film are patterned with the resist film used as a mask. Then, the charge-dissipating film is removed.

The step of forming a phase shifter film further includes the steps of forming a monolayer film of an approximately homogeneous material, and forming a transmitting film whose transmittance is less dependent on a wavelength when used in combination with the monolayer film.

More preferably, the step of removing the charge-dissipating film includes the step of patterning the transmitting film with the phase shifter film used as a mask.

According to the phase shift mask and the manufacturing method thereof based on the present invention, the phase shifter portion includes a monolayer film formed of an approximately homogeneous material, and a transmitting film whose transmittance is less dependent on a wavelength when used in combination with the monolayer film. Accordingly, the transmittance of the phase shifter portion becomes less dependent on wavelength change of transmitting light. Even if light has a longer wavelength than that of the exposure light, for example, the phase shift mask can decrease the transmittance compared to a conventional phase shift mask. As a result, it is possible to increase detection accuracy of a defect generated on the phase shifter portion even with a conventional defect inspection apparatus.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The first embodiment of the present invention will be described hereinafter.

Figure 1:
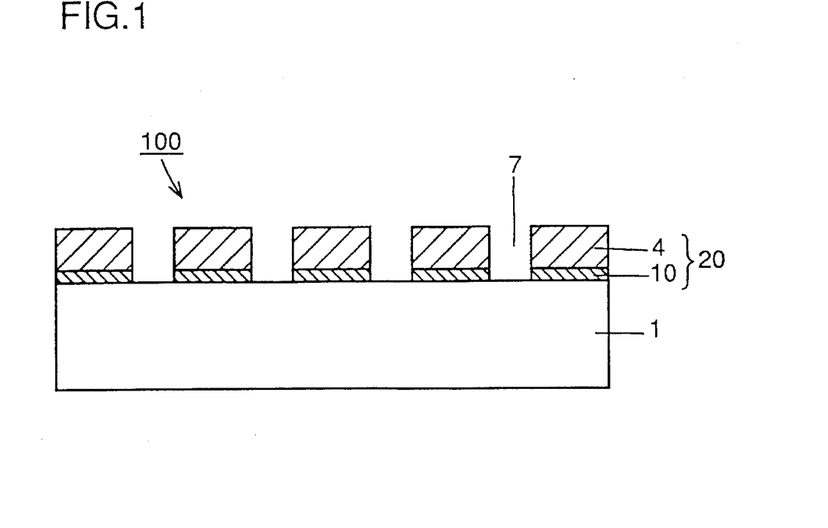
FIG. 1 is a sectional view of a phase shift mask according to a first embodiment of the present invention.

Referring to FIG. 1, a structure of the phase shift mask according to this embodiment will first be described. A phase shift mask 100 includes a quartz substrate 1 transmitting exposure light, and a transmitting film 10 having a predetermined transmittance formed on the main surface of quartz substrate 1. On transmitting film 10, a monolayer film 4 of an approximately homogenous material is formed, which converts the phase angle of the transmitted exposure light by approximately 180° and has a transmittance of 3–20% of the transmitted exposure light when used in combination with transmitting film 10. Monolayer film 4 is formed of a molybdenum silicide oxide film, a molybdenum silicide nitride oxide film, or the like. Monolayer film 4 and transmitting film 10 constitute a phase shifter portion 20.

There are the cases where monolayer film 4 has a slight difference in the ratio of compositions between the lower layer portion and the upper layer portion in the manufacturing process. However, a film formed of the same composition is called a monolayer film in this specification.

Transmitting film 10 is formed of at least a material selected from the group consisting of molybdenum, molybdenum silicide, silicon, tantalum nitride, gold, platinum, silicon nitride, silicon oxide, silicon nitride oxide, titanium, tantalum, tungsten, tantalum oxide, tantalum nitride oxide, titanium oxide, titanium nitride, titanium nitride oxide, tungsten oxide, niobium, niobium oxide, niobium nitride oxide, and silicon carbide.

Figure 16:
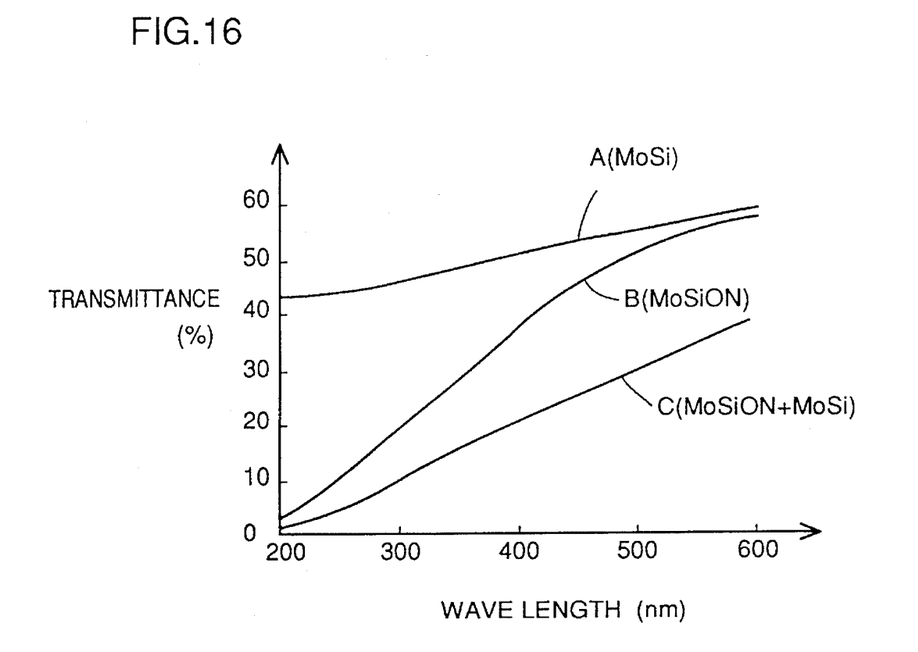
FIG. 16 is a first diagram showing the dependence of the transmittance of the phase shift mask on wavelength according to the present invention.

By using such a material as described above for monolayer film 4 and transmitting film 10, the transmittance of phase shifter portion 20 becomes less dependent on wavelength change of transmitting light. Referring to FIG. 16, for example, description will be given of the case where a molybdenum silicide film is used for transmitting film 10, and a molybdenum silicide nitride oxide film is used for monolayer film 4. With monolayer film 4 and transmitting film 10 both formed of a molybdenum silicide film (A in the figure) and both formed of a molybdenum silicide nitride oxide film (B in the figure), the transmittance of the phase shifter portion increases when the light has a longer wavelength than that of the exposure light. However, with transmitting film 10 formed of a molybdenum silicide film, and monolayer film 4 formed of a molybdenum silicide nitride oxide film (C in the figure), the transmittance of the phase shifter portion can be set smaller even when the light has a longer wavelength than that of the exposure light, compared to the case of a conventional phase shift mask formed of molybdenum silicide nitride oxide.

When a substrate is exposed with light using phase shift mask 100 as structured above, the same effect as that of the phase shift mask of FIG. 16 described in the section of Description of the Background Art can be obtained. According to the phase shift mask of this embodiment, the phase shifter portion is structured on quartz substrate 1 of transmitting film 10 and monolayer film 4 each formed of the above material and having a predetermined transmittance. As a result, the transmittance of the phase shifter portion becomes less dependent on a wavelength than the convention phase shift mask.

As a result, it is possible to increase detection accuracy of a defect generated on the phase shifter portion even with a defect inspection apparatus using a wavelength of 488 nm conventionally used.

A method of manufacturing phase shift mask 100 will now be described with reference to FIGS. 2 to 6.

FIGS. 2 to 6 are sectional views showing the manufacturing process of the phase shift mask shown in FIG. 1.

Figure 2:
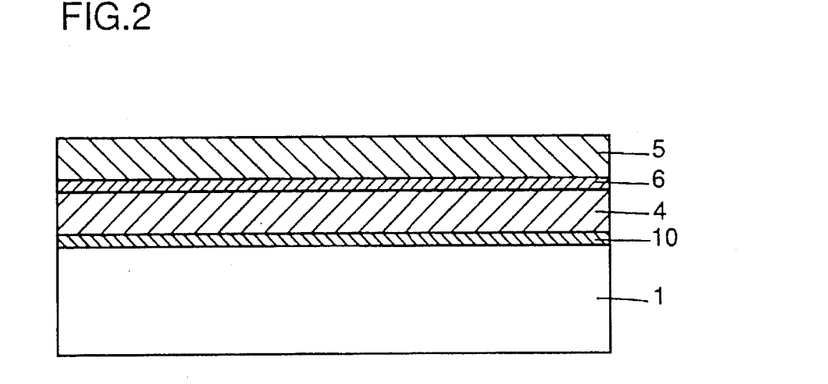
FIGS. 2 to 6 are sectional views showing the first to the fifth steps of the manufacturing process of the phase shift mask according to the first embodiment of the present invention.

Referring to FIG. 2, transmitting film 10 having a predetermined transmittance is first formed on quartz substrate 1. As described above, it is preferred that transmitting film 10 is formed of at least a material selected from the group consisting of molybdenum, molybdenum silicide, silicon, tantalum nitride, gold, platinum, silicon nitride, silicon oxide, silicon nitride oxide, titanium, tantalum, tungsten, tantalum oxide, tantalum nitride oxide, titanium oxide, titanium nitride, titanium nitride oxide, tungsten oxide, niobium, niobium oxide, niobium nitride oxide, and silicon carbide.

Then, monolayer film 4 of a molybdenum silicide oxide film or a molybdenum silicide nitride oxide film is formed on transmitting film 10 by a sputtering method, to form mask blanks. In order to stabilize the transmittance of monolayer film 4, heating at a temperature of 200° C. or more is carried out using a clean oven or the like. As a result, a transmittance variation (0.5–1.0%) caused by later heating step (at approximately 180° C.) such as a resist application step at the time of formation of the phase shifter film can be prevented in advance.

In order to prevent charging-up when an electron beam resist film, to be formed later, is exposed with electron beams, charge-dissipating film 6 of molybdenum or the like of approximately 100 Å thick is formed on monolayer film 4. Then, electron beam resist film 5 of approximately 5000 Å thick (ZEP-810S® manufactured by Nippon Zeon Co., Ltd.) is formed on monolayer film 4.

Figure 3:
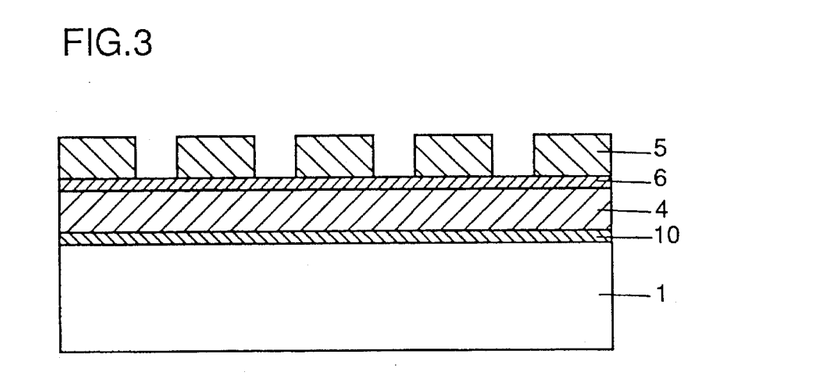

Referring to FIG. 3, electron beams are directed to electron beam resist film 5 so as to form a predetermined pattern. Then, by developing resist film 5, resist film 5 having a resist pattern of a predetermined shape is formed.

Figure 4:
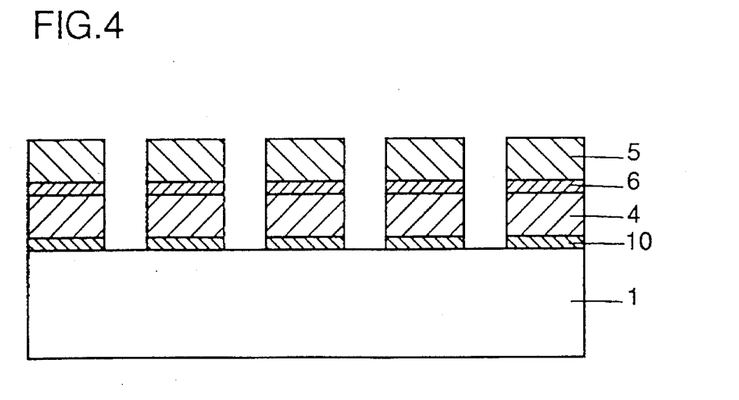

Referring to FIG. 4, monolayer film 4 and charge-dissipating film 6 are etched with resist film 5 used as a mask. This etching is carried out with a parallel plate type RF ion etching device with the distance between electrode substrates set to 60 mm, the working pressure set to 0.3 Torr, the reactive gas of $CF_4$ and $O_2$ having flow rates of approximately 95 sccm and approximately 5 sccm, respectively, and the etching time set to approximately 11 minutes.

Figure 5:
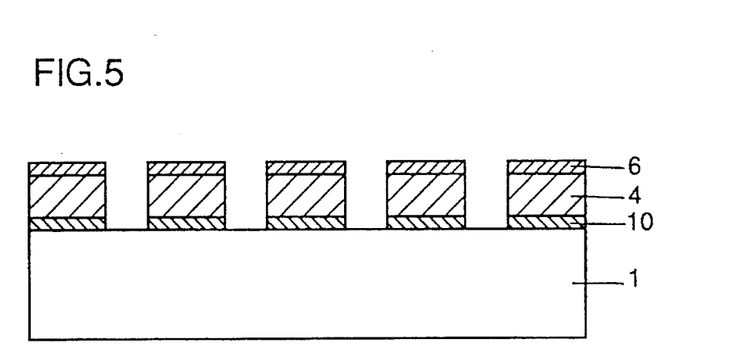
Figure 6:
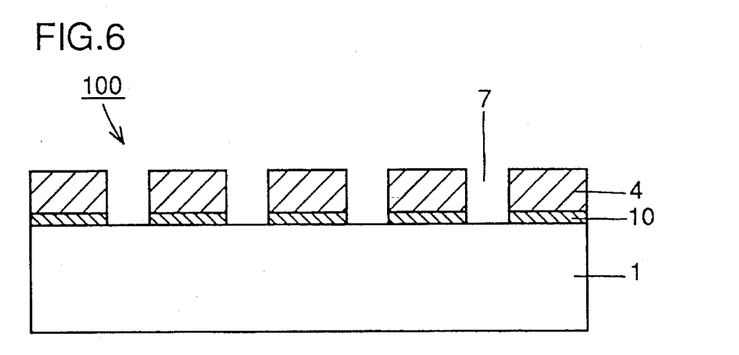

Referring to FIG. 5, resist film 5 is removed. Then, referring to FIG. 6, charge-dissipating film 6 formed of a molybdenum film, for example, is removed using sulfuric acid at a temperature of 50°–100° C. Accordingly, the phase shift mask shown in FIG. 1 is completed.

The second embodiment of the present invention will now be described with reference to FIG. 7.

A phase shift mask 150A of the second embodiment has the same structure as that of phase shift mask 100 shown in FIG. 1. However, these masks are different from each other in a material of transmitting film 10. Transmitting film 10 of this embodiment is formed of at least a material selected from the group consisting of chromium, chromium oxide, chromium nitride oxide, chromium nitride carbide oxide, nickel chromium, nickel, Inconel, indium oxide, tin oxide, tin indium oxide, aluminum, and aluminum oxide.

Figure 17:
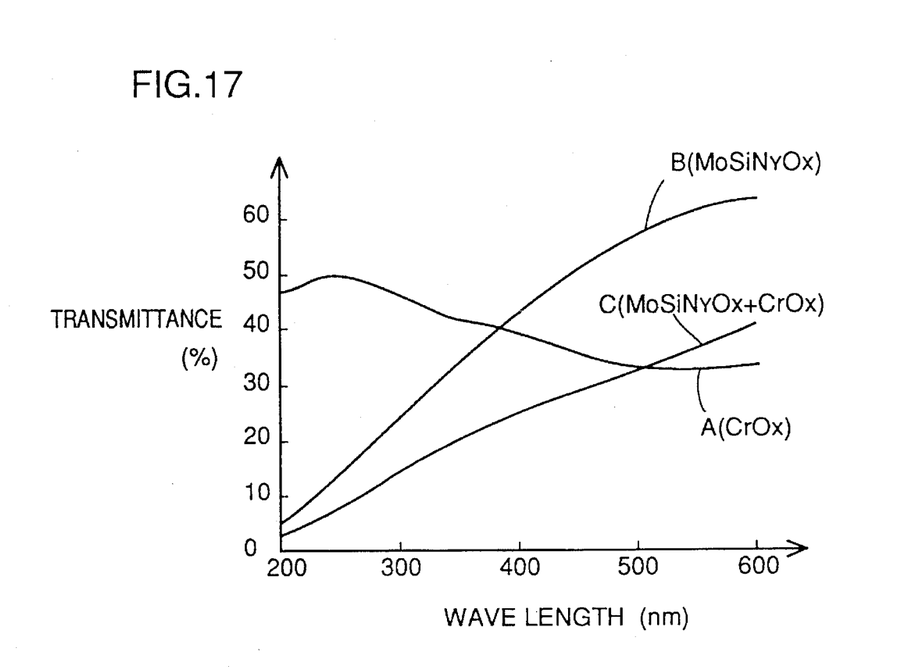
FIG. 17 is a second diagram showing the dependence of the transmittance of the phase shift mask on wavelength according to the present invention.

As described above, even when monolayer film 4 and transmitting film 10 are formed of such a material as described above, the transmittance of phase shifter portion 20 becomes less dependent on wavelength change of transmitting light, similar to the first embodiment. For example, referring to FIG. 17, description will be given of the dependence of the transmittance on the wavelength in the case where a chromium oxide film is used for transmitting film 10, and a molybdenum silicide nitride oxide film is used for monolayer film 4. As shown in the figure, the transmittance of light transmitting through a molybdenum silicide nitride oxide film (B in the figure) becomes larger as the wavelength of light becomes longer. However, with transmitting film 10 formed of a chromium oxide film and monolayer film 4 formed of a molybdenum silicide nitride oxide film (C in the figure), the transmittance of the phase shifter portion can be set smaller even if the wavelength of light becomes long, compared to the phase shifter portion only formed of a molybdenum silicide nitride oxide film.

A method of manufacturing phase shift mask 150 will now be described with reference to FIGS. 8 to 12.

Figure 7:
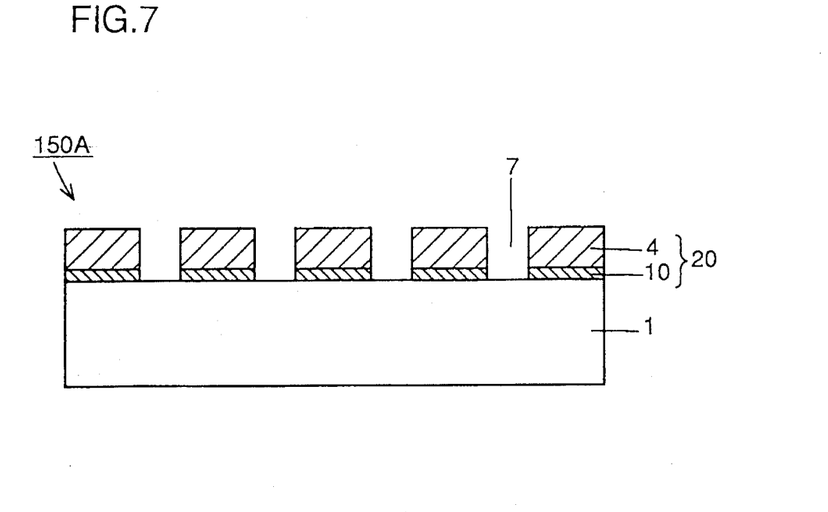
FIG. 7 is a sectional view of a phase shift mask according to a second embodiment of the present invention.

FIGS. 8 to 12 are sectional views showing the manufacturing process of phase shift mask 150A shown in FIG. 7.

Figure 8:
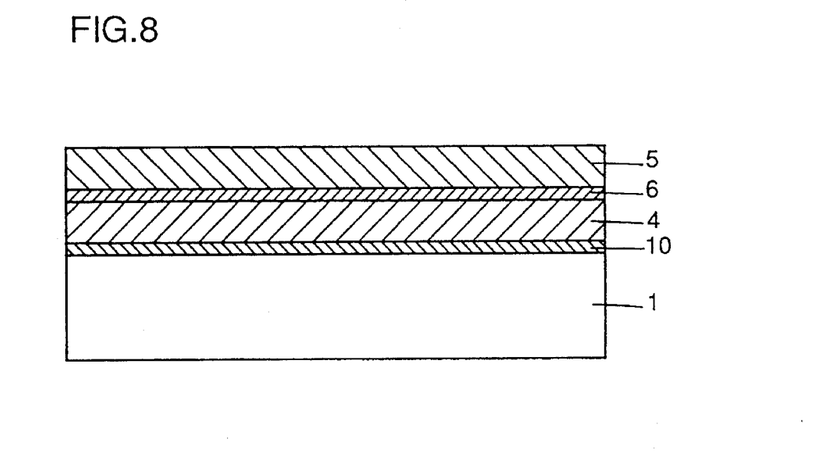
FIGS. 8 to 12 are sectional views showing the first to the fifth steps of the manufacturing process of the phase shift mask according to the second embodiment of the present invention.

Referring to FIG. 8, transmitting film 10 having a predetermined transmittance is first formed on quartz substrate 1. It is preferred that transmitting film 10 is formed of at least a material selected from the group consisting of chromium, chromium oxide, chromium nitride oxide, chromium nitride carbide oxide, nickel chromium, nickel, Inconel, indium oxide, tin oxide, tin indium oxide, aluminum, and aluminum oxide.

Monolayer film 4 formed of a molybdenum silicide oxide film or a molybdenum silicide nitride oxide film is formed on transmitting film 10 by a sputtering method to form mask blanks. Then, in order to stabilize the transmittance of monolayer film 4, heating at a temperature of 200° C. or more is carried out using a clean oven or the like. As a result, a transmittance variation (0.5–1.0%) caused by later heating step (at approximately 180° C.) such as a resist application step at the time of formation of the monolayer film can be prevented in advance.

In order to prevent static charge in exposing an electron beam resist film, to be formed later, with electron beams, charge-dissipating film 6 of molybdenum or the like of approximately 100 Å thick is formed on monolayer film 4. Then, electron beam resist film 5 (ZEP-810S® manufactured by Nippon Zeon Co., Ltd.) of approximately 5000 Å thick is formed on phase shifter film 4.

Figure 9:
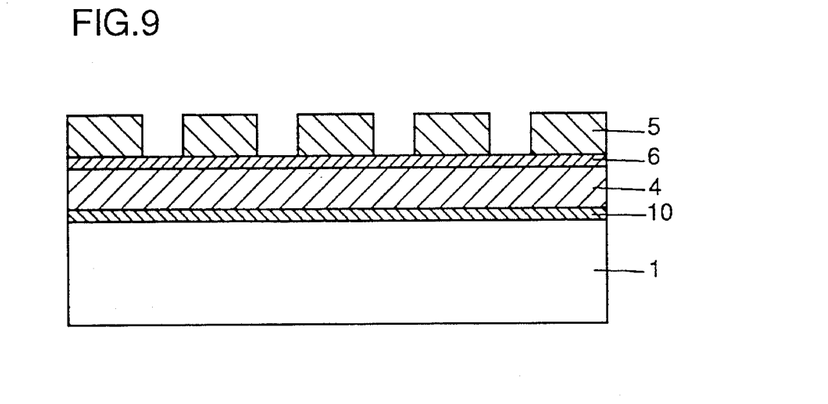

Referring to FIG. 9, electron beams are directed to electron beam resist film 5 so as to form a predetermined pattern. Then, by developing resist film 5, resist film 5 having a resist pattern of a predetermined shape is formed.

Figure 10:
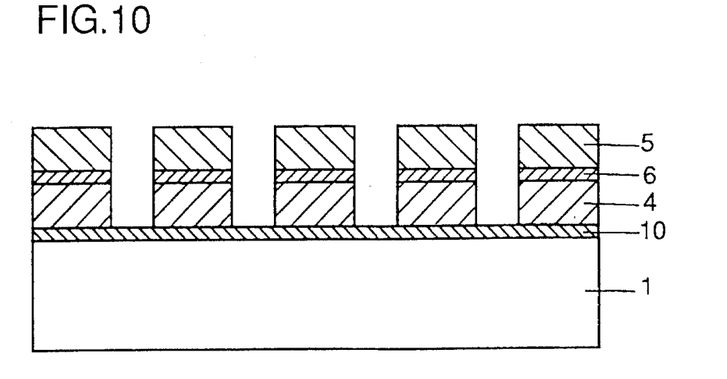

Referring to FIG. 10, phase shifter film 4 and charge-dissipating film 6 are etched with resist film 5 used as a mask. This etching is carried out with a parallel plate type RF ion etching device, with the distance between electron substrates set to 60 mm, the working pressure 0.3 Torr, the reactive gas of $CF_4$ and $O_2$ having flow rates of approximately 95 sccm and approximately 5 sccm, respectively, and the etching time set to approximately 11 minutes.

At this step, transmitting film 10 is not etched by the reactive gas of $CF_4+O_2$. Therefore, unlike the conventional case, quartz substrate 1 is not overetched by the etching gas.

Figure 11:
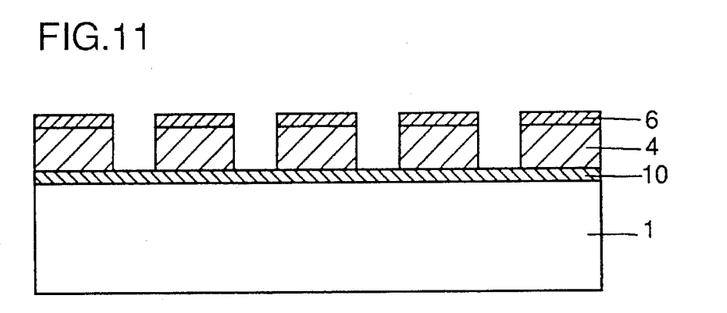
Figure 12:
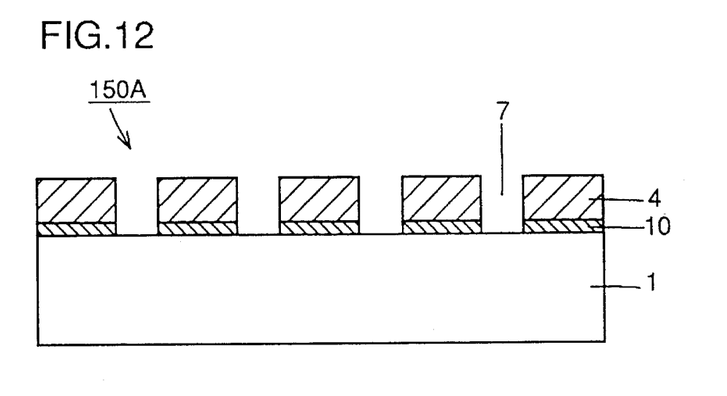

Referring to FIG. 11, resist film 5 is removed. Then, referring to FIG. 12, by using Cr wet etchant or the like, both charge-dissipating film 6 of molybdenum, for example, and exposed transmitting film 10 are simultaneously removed. Accordingly, the phase shift mask shown in FIG. 7 is completed.

Figure 13:
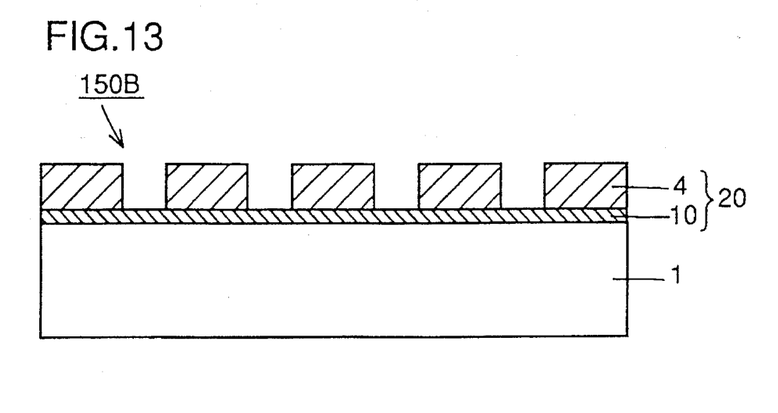
FIG. 13 is a sectional view of a phase shift mask according to a third embodiment of the present invention.

The third embodiment of the present invention will be described with reference to FIGS. 13 to 15. In the structure of a phase shift mask 150B in the third embodiment, transmitting film 10 is formed of the same material as that of transmitting film 10 used in phase shift mask 150A shown in the second embodiment. However, transmitting film 10 is formed in a light transmitting portion 7. Even when transmitting portion 10 remains in light transmitting portion 7, it is possible to obtain the same effects as those of the first and second embodiments, by adjusting the thicknesses of transmitting film 10 and monolayer film 4 so that the transmittance of the exposure light transmitting through phase shifter portion 20 is 3–20%, and that the phase angle is converted by approximately 180°, both relative to light transmitting portion 7.

Description will now be given of the manufacturing process of this embodiment. It should be noted that in this embodiment, transmitting film 10 is formed of a material selected from the group consisting of chromium, chromium oxide, chromium nitride oxide, chromium nitride carbide oxide, nickel chromium, nickel, Inconel, indium oxide, tin oxide, tin indium oxide, aluminum, and aluminum oxide, similar to the case of the second embodiment.

Since the same steps as shown in FIGS. 8 to 10 of the second embodiment are carried out in this embodiment, the description will not be repeated.

Figure 14:
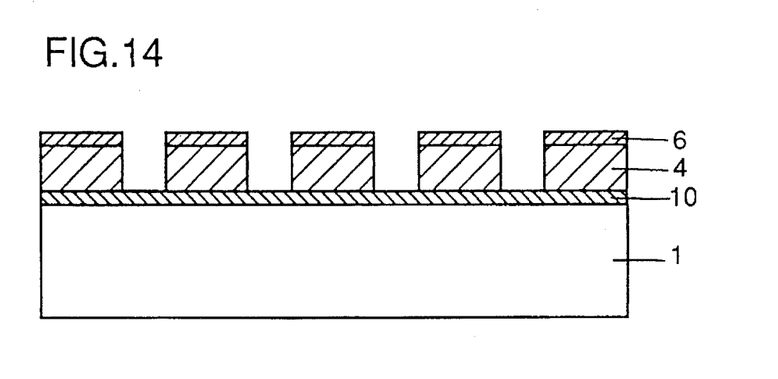
FIGS. 14 and 15 are sectional views showing the first to the second steps of the manufacturing process of the phase shift mask according to the third embodiment of the present invention.
Figure 15:
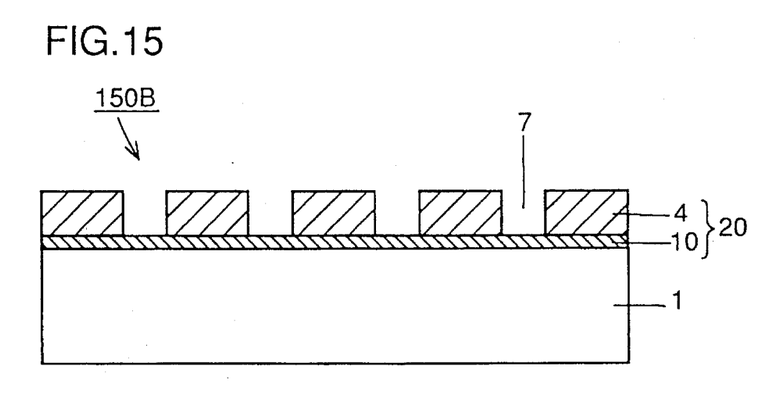

Referring to FIG. 14, resist film 5 is removed. Then, referring to FIG. 15, by using sulfuric acid at a temperature of 50° to 100° C., anti-static film 6 of molybdenum, for example, is removed. Accordingly, phase shift mask 150B of this embodiment is completed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A phase shift mask, comprising:

a substrate transmitting exposure light; and a phase shifter portion formed in a predetermined region on said substrate for converting a phase angle of said transmitted exposure light by approximately 180° and having a transmittance of 3–20% of said transmitted exposure light, wherein said phase shifter portion includes a monolayer film formed of an approximately homogeneous material, and a transmitting film whose transmittance is less dependent on a wavelength when used in combination with said monolayer film.

2. The phase shift mask as recited in claim 1, wherein:

a light transmitting portion from which said substrate is exposed is formed in a predetermined region on said substrate.

3. The phase shift mask as recited in claim 2, wherein:

said transmitting film is formed on said substrate surface of said light transmitting portion from which said substrate is exposed.

4. The phase shift mask as recited in claim 1, wherein:

said monolayer film is formed of at least a material selected from the group consisting of oxide of molybdenum silicide and molybdenum silicide nitride oxide, and said transmitting film is formed of at least a material selected from the group consisting of molybdenum, molybdenum silicide, silicon, tantalum nitride, gold, platinum, silicon oxide, silicon nitride oxide, titanium, tantalum, tungsten, tantalum oxide, tantalum nitride oxide, titanium oxide, titanium nitride, titanium nitride oxide, tungsten oxide, niobium, niobium oxide, niobium nitride oxide, and silicon carbide.

5. The phase shift mask as recited in claim 1, wherein:

said monolayer film is formed of at least a material selected from the group consisting of oxide of molybdenum silicide and molybdenum silicide nitride oxide, and said transmitting film is formed of a material selected from the group consisting of chromium, chromium oxide, chromium nitride oxide, chromium nitride carbide oxide, nickel chromium, nickel, Inconel, indium oxide, tin oxide, tin indium oxide, aluminum, and aluminum oxide.

6. A method of manufacturing a phase shift mask, comprising the steps of:

forming in a predetermined region on a main surface of a substrate transmitting exposure light a phase shifter film for converting a phase angle of said transmitted exposure light by approximately 180°, said phase shifter film having a transmittance of 3–20% of said transmitted exposure light;

forming a charge-dissipating film on said phase shifter film;

forming a resist film having a predetermined pattern shape on said charge dissipating film by an electron beam exposure method;

patterning said charge-dissipating film and said phase shifter film with said resist film used as a mask; and removing said charge-dissipating film, wherein said step of forming a phase shifter film includes the steps of forming a monolayer film of an approximately homogenous material, and forming a transmitting film whose transmittance is less dependent on a wavelength when used in combination with said monolayer film.

7. The method of manufacturing a phase shift mask as recited in claim 6, wherein:

said step of removing said charge-dissipating film includes the step of patterning said transmitting film with said phase shifter film used as a mask.

* * * * *